US010505569B2

(12) United States Patent
Naito et al.

(10) Patent No.: US 10,505,569 B2
(45) Date of Patent: Dec. 10, 2019

(54) RADIO RECEIVER AND INTERMEDIATE FREQUENCY SIGNAL GENERATION METHOD

(71) Applicant: RENESAS ELECTRONICS CORPORATION, Tokyo (JP)

(72) Inventors: Wataru Naito, Tokyo (JP); Noriyoshi Izumi, Tokyo (JP); Kazuhiro Kijima, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/154,459

(22) Filed: Oct. 8, 2018

(65) Prior Publication Data

US 2019/0181888 A1    Jun. 13, 2019

(30) Foreign Application Priority Data

Dec. 8, 2017  (JP) .................................. 2017-236395

(51) Int. Cl.
*H03D 3/00*        (2006.01)
*H04B 1/00*        (2006.01)
(Continued)

(52) U.S. Cl.
CPC ........... *H04B 1/0007* (2013.01); *H03D 3/004* (2013.01); *H03D 3/007* (2013.01); *H03D 7/166* (2013.01);
(Continued)

(58) Field of Classification Search
CPC ........ H03D 7/166; H03D 3/004; H03D 3/007; H03H 19/004; H04B 1/0007; H04B 1/1036; H04B 1/30; H04B 1/406; H04B 1/16
(Continued)

(56) References Cited

U.S. PATENT DOCUMENTS 4,135,158 A  *  1/1979  Parmet ................. G04G 9/0064
                                                        331/1 A
4,630,283 A  *  12/1986  Schiff ..................... H04B 1/707
                                                        329/325
(Continued)

FOREIGN PATENT DOCUMENTS

JP           2007-158780 A       6/2007

OTHER PUBLICATIONS

Extended European Search Report issued in corresponding European Patent Application No. 18199255.3-1220, dated Feb. 12, 2019.

*Primary Examiner* — James M Perez
(74) *Attorney, Agent, or Firm* — McDermott Will & Emery LLP

(57) ABSTRACT

An IF filter band-limits an intermediate frequency signal outputted from a mixer. An AFC unit controls the oscillation frequency of a PLL so that the frequency of the intermediate frequency signal is a predetermined frequency. When the AFC unit controls the oscillation frequency of the PLL, a band control unit controls the passing characteristic of the IF filter to the passing characteristic of a wide band, and after the completion of the control, controls the passing characteristic of the IF filter to the passing characteristic of a narrow band. A frequency correction unit refers to a filter information storage unit, and corrects the oscillation frequency controlled by the AFC unit according to the difference between the center frequency of the passband of the passing characteristic of the wide band and the center frequency of the passband of the passing characteristic of the narrow band.

11 Claims, 9 Drawing Sheets

(51) Int. Cl.
*H04B 1/16* (2006.01)
*H03D 7/16* (2006.01)
*H03H 19/00* (2006.01)
*H04B 1/10* (2006.01)
*H04B 1/30* (2006.01)
*H04B 1/403* (2015.01)

(52) U.S. Cl.
CPC ......... *H03H 19/004* (2013.01); *H04B 1/1036* (2013.01); *H04B 1/16* (2013.01); *H04B 1/30* (2013.01); *H04B 1/406* (2013.01)

(58) Field of Classification Search
USPC .................................................. 375/316–352
See application file for complete search history.

(56) References Cited

U.S. PATENT DOCUMENTS

| | | | | |
|---|---|---|---|---|
| 4,694,471 A * | 9/1987 | Blesser | | H04L 27/10 375/272 |
| 5,892,799 A * | 4/1999 | Jaakkola | | H04L 27/3836 348/725 |
| 5,937,341 A * | 8/1999 | Suominen | | H03D 3/007 375/324 |
| 6,289,061 B1 * | 9/2001 | Kandala | | H04B 1/7115 375/326 |
| 6,771,937 B2 * | 8/2004 | Doetsch | | H03J 7/047 375/344 |
| 6,785,525 B2 * | 8/2004 | Ries | | H03B 21/02 331/179 |
| 7,082,290 B2 * | 7/2006 | Takano | | H03G 3/3047 375/300 |
| 7,092,043 B2 * | 8/2006 | Vorenkamp | | H01F 17/0006 257/E27.046 |
| 7,158,774 B2 * | 1/2007 | Helio | | H03H 11/1252 455/266 |
| 7,177,895 B2 * | 2/2007 | Na | | H03H 11/1291 708/819 |
| 7,187,913 B1 * | 3/2007 | Rahn | | H03J 1/005 348/731 |
| 7,340,232 B2 * | 3/2008 | Murakami | | H04B 1/30 455/209 |
| 7,522,896 B2 * | 4/2009 | Oshima | | H04B 1/1027 455/136 |
| 8,170,151 B2 * | 5/2012 | Suzuki | | H03J 7/04 329/300 |
| 8,175,204 B2 * | 5/2012 | Kawauchi | | H04L 25/0216 375/260 |
| 8,185,076 B2 * | 5/2012 | Miura | | H04B 1/30 348/726 |
| 8,249,129 B2 * | 8/2012 | Fudge | | H04B 1/7136 341/152 |
| 8,902,365 B2 * | 12/2014 | Greggain | | H04N 5/46 348/537 |
| 9,197,403 B2 * | 11/2015 | Gauthier | | H04L 7/0331 |
| 9,306,789 B2 * | 4/2016 | Dhayni | | H04L 27/2657 |
| 9,325,553 B2 * | 4/2016 | Kaukovuori | | H04B 1/0057 |
| 9,602,317 B1 * | 3/2017 | Hailu | | H04L 25/03885 |
| 9,893,924 B2 * | 2/2018 | Smail | | H04L 27/265 |
| 10,211,845 B2 * | 2/2019 | Naito | | H03M 1/1023 |
| 2002/0094037 A1 * | 7/2002 | Darabi | | H04L 25/062 375/316 |
| 2003/0008628 A1 * | 1/2003 | Lindell | | H03J 3/08 455/180.1 |
| 2004/0005022 A1 * | 1/2004 | Zhu | | H04L 27/2662 375/365 |
| 2004/0041598 A1 * | 3/2004 | Taki | | H03J 3/08 327/113 |
| 2004/0125240 A1 * | 7/2004 | Stikvoort | | H03D 3/007 348/731 |
| 2005/0048939 A1 * | 3/2005 | McMullin | | H04B 1/28 455/189.1 |
| 2006/0226897 A1 * | 10/2006 | De Ruijter | | H03D 3/007 329/315 |
| 2008/0152049 A1 * | 6/2008 | Sandner | | H04H 40/18 375/344 |
| 2009/0003496 A1 * | 1/2009 | Amano | | H04B 1/28 375/346 |
| 2009/0143031 A1 * | 6/2009 | Shah | | H03D 7/14 455/114.1 |
| 2009/0225905 A1 * | 9/2009 | Suzuki | | H03J 3/08 375/334 |
| 2009/0238206 A1 * | 9/2009 | Hamada | | H04B 1/50 370/468 |
| 2009/0243736 A1 * | 10/2009 | Miura | | H03L 7/099 331/1 R |
| 2010/0074631 A1 * | 3/2010 | Mahowald | | H04B 10/1141 398/202 |
| 2010/0164554 A1 * | 7/2010 | Tsuyama | | G11B 5/09 327/103 |
| 2011/0044408 A1 * | 2/2011 | Ahmad | | H04L 27/2675 375/340 |
| 2011/0105068 A1 * | 5/2011 | Reddy | | H04B 1/0014 455/207 |
| 2011/0134986 A1 * | 6/2011 | Skull | | H04L 27/01 375/229 |
| 2011/0195683 A1 * | 8/2011 | Brekelmans | | H04B 1/0096 455/182.1 |
| 2011/0293040 A1 * | 12/2011 | Dupont | | H03H 21/0018 375/316 |
| 2012/0008799 A1 * | 1/2012 | Disch | | G10L 19/0204 381/98 |
| 2012/0134398 A1 * | 5/2012 | Gamage | | H04L 27/2666 375/224 |
| 2013/0051496 A1 * | 2/2013 | Li | | H04B 1/28 375/334 |
| 2013/0156074 A1 * | 6/2013 | Wang | | H04B 1/1027 375/219 |
| 2014/0098839 A1 * | 4/2014 | Wang | | G01S 19/33 375/147 |
| 2017/0094596 A1 * | 3/2017 | Kijima | | H03L 7/185 |
| 2018/0367157 A1 * | 12/2018 | Naito | | H03M 1/1023 |
| 2019/0181888 A1 * | 6/2019 | Naito | | H03D 3/004 |

* cited by examiner

| CAPACITANCE PARAMETER ADJUSTMENT CODE | CUT-OFF FREQUENCY_ LOW FREQUENCY SIDE [kHz] | CUT-OFF FREQUENCY_ HIGH FREQUENCY SIDE [kHz] | BAND WIDTH [kHz] | BW CENTER FREQUENCY [kHz] |
|---|---|---|---|---|
| 0 | 250 | 750 | 500 | 500 |
| 1 | 240 | 680 | 440 | 460 |
| 2 | 230 | 660 | 430 | 445 |
| 3 | 220 | 640 | 420 | 430 |
| 4 | 210 | 620 | 410 | 415 |
| 5 | 200 | 600 | 400 | 400 |
| 6 | 190 | 580 | 390 | 385 |
| 7 | 180 | 560 | 380 | 370 |

RADIO RECEIVER AND INTERMEDIATE FREQUENCY SIGNAL GENERATION METHOD

CROSS-REFERENCE TO RELATED APPLICATIONS

The disclosure of Japanese Patent Application No. 2017-236395 filed on Dec. 8, 2017 including the specification, drawings and abstract is incorporated herein by reference in its entirety.

BACKGROUND

The present invention relates to a radio receiver and an intermediate frequency signal generation method. For example, the present invention relates to a radio receiver converting a radio frequency signal to an intermediate frequency signal and receiving the intermediate frequency signal and an intermediate frequency signal generation method of such the radio receiver.

Japanese Unexamined Patent Application Publication No. 2007-158780 (Patent Literature 1) discloses a passband limiting device used in an FSK (Frequency Shift Keying) receiving apparatus. In the FSK receiving apparatus, a mixer mixes an RF (Radio Frequency) signal inputted through an antenna and a local oscillation signal, and generates an IF (Intermediate Frequency) signal. A BPF (Band Pass Filter) passes only the signal in a predetermined frequency band of the IF signal outputted from the mixer, and attenuates the signals in bands other than that, thereby band-limiting the IF signal. An AD (Analog to Digital) converter converts the band-limited IF signal to a digital signal.

The IF signal converted to the digital signal is further band-limited by using digital filters including an HPF (High Pass Filter) and an LPF (Low Pass Filter). Two types of filter coefficients can be set to each of the HPF and the LPF. A filter coefficient selection unit selects the filter coefficient of each of the HPF and the LPF, and switches the band width of a passband formed by using the HPF and the LPF between the band width of a wide band and the band width of a narrow band. The band width of the wide band is set in consideration of the temperature deviation, the change with time, and the like of a local oscillator assumed on the system. The band width of the narrow band is set in consideration of the signal spectrum of the IF signal and the like.

When an AFC (Automatic Frequency Control) operation is performed, the filter coefficient selection unit selects, from among the two types of filter coefficients that can be set to the HPF, the filter coefficient in which the high cut-off frequency is high, and selects, from among the two types of filter coefficients that can be set to the LPF, the filter coefficient in which the low cut-off frequency is low. In such a manner, the band width of the passband formed by using the HPF and the LPF is set to the wide band. After the AFC operation is performed, the filter coefficient selection unit selects, from among the two types of filter coefficients that can be set to the HPF, the filter coefficient in which the high cut-off frequency is low, and selects, from among the two types of filter coefficients that can be set to the LPF, the filter coefficient in which the low cut-off frequency is high. In such a manner, the bandwidth of the passband formed by using the HPF and the LPF is set to the narrow band.

In Patent Literature 1, in the AFC operation, the IF signal in the wide band is used to control the frequency of the local oscillation signal so that the frequency of the IF signal coincides with the center frequency of the HPF and the LPF. In Patent Literature 1, during the AFC operation, the passband width formed by using the HPF and the LPF is set to the wide band, so that even when the frequency of the IF signal is greatly shifted from the center frequency of the HPF and the LPF due to the temperature deviation, the secular deviation, and the like of the local oscillator, the AFC operation can be performed correctly. In addition, after the AFC operation, the passband width formed by using the HPF and the LPF is narrowed to coincide with the signal spectrum of the IF signal, so that even under the influence from the adjacent channel, the reception sensitivity can be prevented from being deteriorated.

SUMMARY

However, in Patent Literature 1, the HPF and the LPF are configured as the digital filters performing filter processing with respect to the IF signal after the AD conversion. In Patent Literature 1, when the passband formed by using the HPF and the LPF is switched from the wide band to the narrow band, the center frequency of the HPF and the LPF is not changed. The present inventors have found a problem that when the passband is switched, for example, by the analog BPF before the AD conversion, the center frequency is changed before and after the switching of the passband, so that the reception performance is deteriorated.

Other objects and novel features will be apparent from the description herein and the accompanying drawings.

According to an embodiment, a radio receiver includes a quadrature demodulator mixing an oscillation signal outputted from an oscillator and a radio frequency signal to generate an intermediate frequency signal, a band pass filter band-limiting the intermediate frequency signal, a filter information storage unit storing information representing the center frequency of the passband of the band pass filter, a frequency control unit controlling the frequency of the intermediate frequency signal to a predetermined frequency, and a frequency correction unit correcting the frequency of the oscillation signal. In a state where the band pass filter band-limits the intermediate frequency signal by the passing characteristic of a wide band, the frequency control unit controls the frequency of the intermediate frequency signal. After the frequency of the intermediate frequency signal is controlled, the passing characteristic of the band pass filter is controlled to the passing characteristic of a narrow band. The frequency correction unit corrects the frequency of the oscillation signal according to the difference between the center frequency of the passband of the passing characteristic of the wide band and the center frequency of the passband of the passing characteristic of the narrow band.

According to the embodiment, even when the center frequency of the passband of the band pass filter is changed at changing the passing characteristic of the band pass filter, the reception performance can be prevented from being deteriorated.

DETAILED DESCRIPTION

Figure 8:
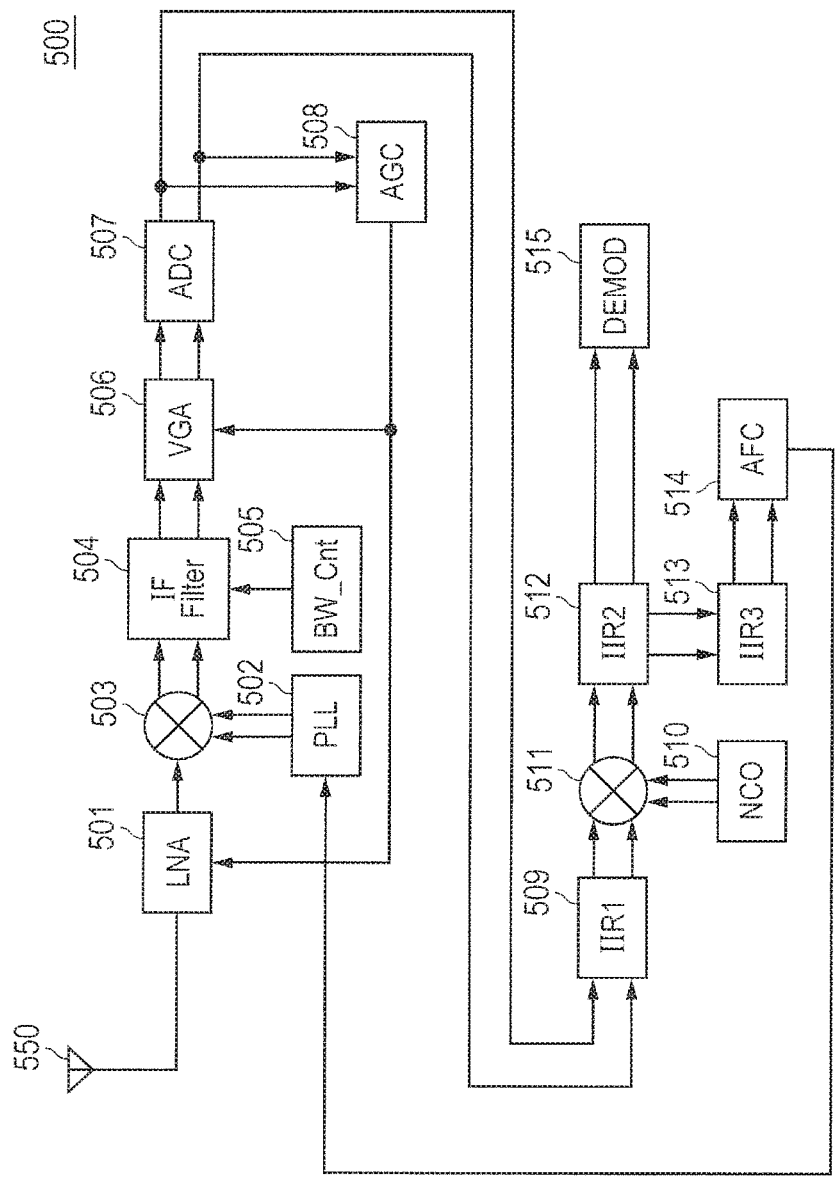
FIG. 8 is a block diagram illustrating a radio receiver used for study.

Prior to describing embodiments, the matters studied by the present inventors will be described. FIG. 8 illustrates a radio receiver used for study. An antenna 550 receives a radio frequency signal (RF signal) in a SubGHz band, such as a 920 MHz band. An LNA (Low Noise Amplifier) 501 amplifies the RF signal. A PLL (Phase locked loop) 502 configures a local oscillator, and outputs a local oscillation signal to a mixer 503. The mixer 503 configures a quadrature demodulator, and multiplies the RF signal inputted through the LNA 501 and the local oscillation signal outputted from the PLL 502. The mixer 503 that has multiplied the RF signal and the local oscillation signal down-converts the RF signal in the SubGHz band to a low intermediate frequency signal (Low-IF signal) of, for example, 500 kHz.

An IF filter 504 is, for example, an analog RC filter whose passband is variable, and band-limits the IF signal to attenuate the interference wave included in the IF signal. A VGA (Variable Gain Amplifier) 506 amplifies the band-limited IF signal, and an AD converter 507 then converts the amplified IF signal to a digital value. An AGC (Auto Gain Control) unit 508 adjusts the gains of the LNA 501 and the VGA 506 based on the IF signal converted to the digital signal, and controls the electric power of the IF signal inputted to the AD converter 507 to an appropriate electric power value.

The IF signal converted to the digital signal by the AD converter 507 is inputted through an IIR (Infinite Impulse Response) filter 509 to a mixer 511. The mixer 511 complex-multiplies an oscillation signal outputted from an NCO (Numerical Controlled Oscillator) 510 and the IF signal inputted through the IIR filter 509, and down-converts the IF signal to a BB (Base Band) signal. The BB signal is inputted through a filter IIR 512 to a demodulator (DEMOD) 515, and the demodulator 515 then performs demodulation processing and the like with respect to the inputted BB signal. In addition, the BB signal is inputted through the IIR filter 512 and an IIR filter 513 to an AFC unit 514, and the AFC unit 514 then performs an AFC operation to correct the frequency deviation.

In the demodulation circuit of the above-described Low-IF system, the IF filter 504 attenuates the interference wave outside the desired band included in the IF signal after the mixing. At this time, when the interference wave is present in the passband of the IF filter 504 or the IF filter 504 attenuates the desired wave, the reception performance is deteriorated. The passing characteristic of the IF filter 504 is variable, and a band control unit 505 controls the passing characteristic of the IF filter 504. The band control unit 505 sets the passing characteristic of the IF filter 504 to a wide band during the AFC operation, and sets the passing characteristic of the IF filter 504 to a narrow band after the AFC operation.

Figure 9A:
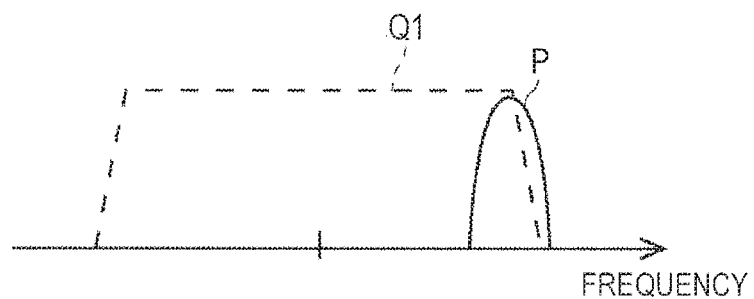
FIGS. 9A to 9C are schematic graphs illustrating the relation between the band of the IF signal and the passbands of a band pass filter.
Figure 9B:
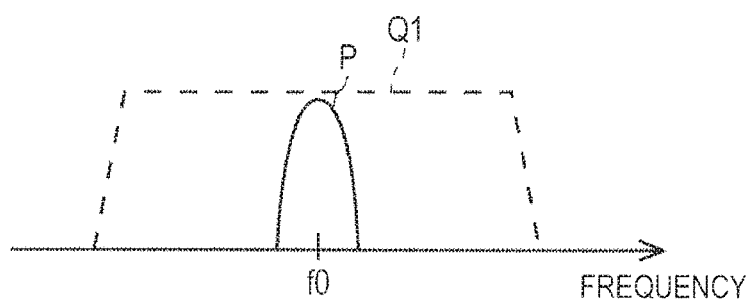
Figure 9C:
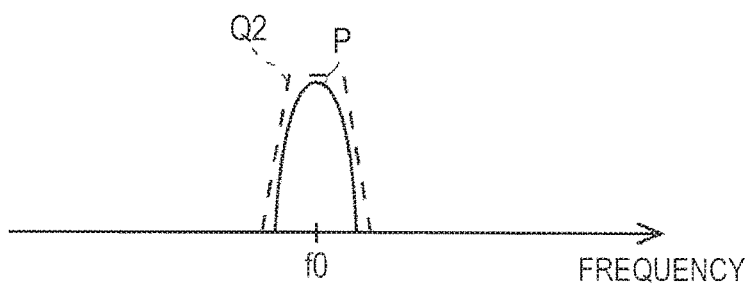

FIGS. 9A to 9C illustrate the relation between the band of the IF signal and the passbands of a band pass filter. In FIGS. 9A to 9C, the ordinate axis represents the signal intensity or gain, and the abscissa axis represents the frequency. FIG. 9A illustrates the relation between the band of the IF signal and the passband before the AFC operation is performed. Typically, the frequency of the IF signal is represented by the difference between the frequency of the RF signal and the frequency of the local oscillation signal. When there is a deviation in at least one of the RF signal and the local oscillation signal, the frequency of the IF signal is shifted from a predetermined frequency of, for example, 500 kHz and the like, by the frequency deviation. In the example of FIG. 9A, the frequency of an IF signal P is shifted from a predetermined frequency f0 of, for example, 500 kHz and the like, to the high frequency side.

In the AFC operation, the oscillation frequency of the local oscillator is controlled so that the frequency of the IF signal P coincides with the predetermined frequency f0. During the AFC operation, the passband of the band pass filter is set to, for example, a passing characteristic Q1 of the wide band illustrated in FIG. 9A. Since the passband is set to the passing characteristic Q1 of the wide band during the AFC operation, the AFC operation can be performed correctly even when the frequency of the IF signal P is greatly shifted from the predetermined frequency f0.

FIG. 9B illustrates the relation between the band of the IF signal and the passband at the completion of the AFC operation. By performing the AFC operation, the frequency of the IF signal P shifted from the predetermined frequency f0 coincides with the predetermined frequency f0. FIG. 9C illustrates the relation between the band of the IF signal and the passband after the AFC operation. If the passband remains set to the passing characteristic Q1 of the wide band after the AFC operation, the signal of the adjacent channel is included as the interference wave in the IF signal that has passed through the band pass filter. To prevent the intrusion of the interference wave and the like, the passband is changed to a passing characteristic Q2 of the narrow band illustrated in FIG. 9C after the AFC operation. By switching the passband to the passing characteristic Q2 of the narrow band, only the signal of the desired wave can be passed to attenuate the signal of the interference wave.

Here, in FIGS. 9A to 9C, the center frequency of the passbands Q1 and Q2 coincides with the predetermined frequency f0. However, in a radio receiver 500 illustrated in FIG. 8, when the IF signal is band-limited by using the IF filter 504 that is the analog filter, the center frequency of the passband is sometimes changed between the passing characteristic of the wide band and the passing characteristic of the narrow band at changing the passband. In FIG. 9C, when the center frequency of the passband of the passing characteristic Q2 is shifted from the predetermined frequency f0, the interference wave intrudes into the passband of the passing characteristic Q2 or part of the desired wave is shifted from the passband of the passing characteristic Q2 and is attenuated, so that the reception performance is deteriorated.

For example, in the IF filter 504 configured as the analog RC filter, one of the capacitance and the resistance is variable to change the cut-off frequency, so that the passband can be switched. In that case, the cut-off frequency of the IF filter 504 can be changed by a simple circuit structure, as compared with the case where both the capacitance and the resistance are variable. However, in that case, the center frequency of the passband is changed with the change of the cut-off frequency, so that a shift occurs between the frequency of the IF signal and the center frequency of the passband of the IF filter 504.

Figure 10:
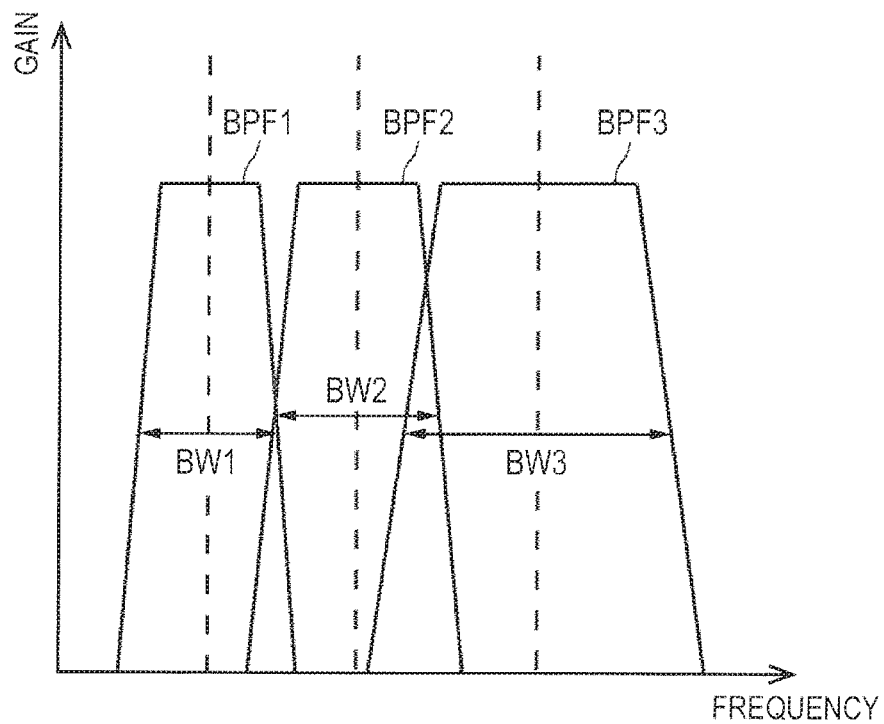
FIG. 10 is a schematic graph illustrating the passing characteristics of the IF filter.

FIG. 10 illustrates the passing characteristics of the IF filter 504. In FIG. 10, the ordinate axis represents the gain, and the abscissa axis represents the frequency. The IF filter 504 band-limits the IF signal by, for example, the passing characteristic selected from among passing characteristics BPF1 to BPF3. The passing characteristics BPF1 to BPF3 can be achieved, for example, by changing the capacitance of the analog RC filter. The passband width of the passing characteristic BPF1 is BW1, the passband width of the passing characteristic BPF2 is BW2, and the passband width of the passing characteristic BPF3 is BW3. When the passband width of the analog RC filter is controlled by changing the capacitance, the center frequencies of the passing characteristics BPF1 to BPF3 having different passband widths do not coincide with each other. The present inventors have found that when the center frequency is changed at changing the passband width, the deterioration of the reception performance occurs, and have made the following embodiments.

The embodiments to which means for solving the problems is applied will be described below in detail with reference to the drawings. For clarify the description, the following description and drawings are omitted and simplified, as needed. In addition, the respective elements illustrated in the drawings, as functional blocks that perform various processes, can include a CPU (Central Processing Unit), a memory, or other circuits in terms of hardware, and are achieved by a program loaded into the memory and the like in terms of software. Thus, those skilled in the art can understand that these functional blocks can be achieved in various forms by hardware alone, software alone, or a combination of them, and each of these functional blocks is not limited to any one of hardware, software, and a combination of them. It should be noted that similar elements are indicated by the same reference signs in the respective drawings, and their overlapped description is omitted, as needed.

In addition, the above-described program is stored by using various types of non-temporary computer readable media, and can be supplied to a computer. The non-temporary computer readable media include various types of actual recording media. Examples of the non-temporary computer readable media include a magnetic recording medium (for example, a flexible disk, a magnetic tape, and a hard disk), an opto-magnetic recording medium (for example, an opto-magnetic disk), a CD-ROM (Read Only Memory) CD-R, a CD-R/W, and a semiconductor memory (for example, a mask ROM, a PROM (Programmable ROM), an EPROM (Erasable PROM), a flash ROM, and a RAM (Random Access Memory)). In addition, the program may be supplied to the computer by various types of temporary computer readable media. Examples of the temporary computer readable media include an electric signal, an optical signal, and an electromagnetic wave. The temporary computer readable media can supply the program to the computer through a wired communication path, such as an electric wire and an optical fiber, or a wireless communication path.

For convenience in description, the following embodiments are divided into a plurality of sections or embodiments, if necessary. However, unless otherwise specified, they are not mutually unrelated, and one of them is related to the modifications, application examples, detailed descriptions, supplementary descriptions, and the like of part or all of the others. In addition, in the following embodiments, when referring to the number of each element including number of pieces, numerical value, amount, range, and the like thereof, it is not limited to a specific number, and may be more than or less than the specific number, unless otherwise specified and except for the case where it is apparently limited to the specific number in principle, and the like.

Further, in the following embodiments, each component including an element step, and the like thereof is not always required, unless otherwise specified and except for the case where it is considered that it is apparently required in principle, and the like. Likewise, in the following embodiments, when referring to the shape, position relation, and the like of each component and the like, a shape, position relation, and the like that are substantially approximate or similar thereto are included, unless otherwise specified and except for the case where it is considered that they are not apparently substantially approximate or similar thereto in principle, and the like. This is ditto for the above-described number including number of pieces, numerical value, amount, range, and the like.

First Embodiment

Figure 1:
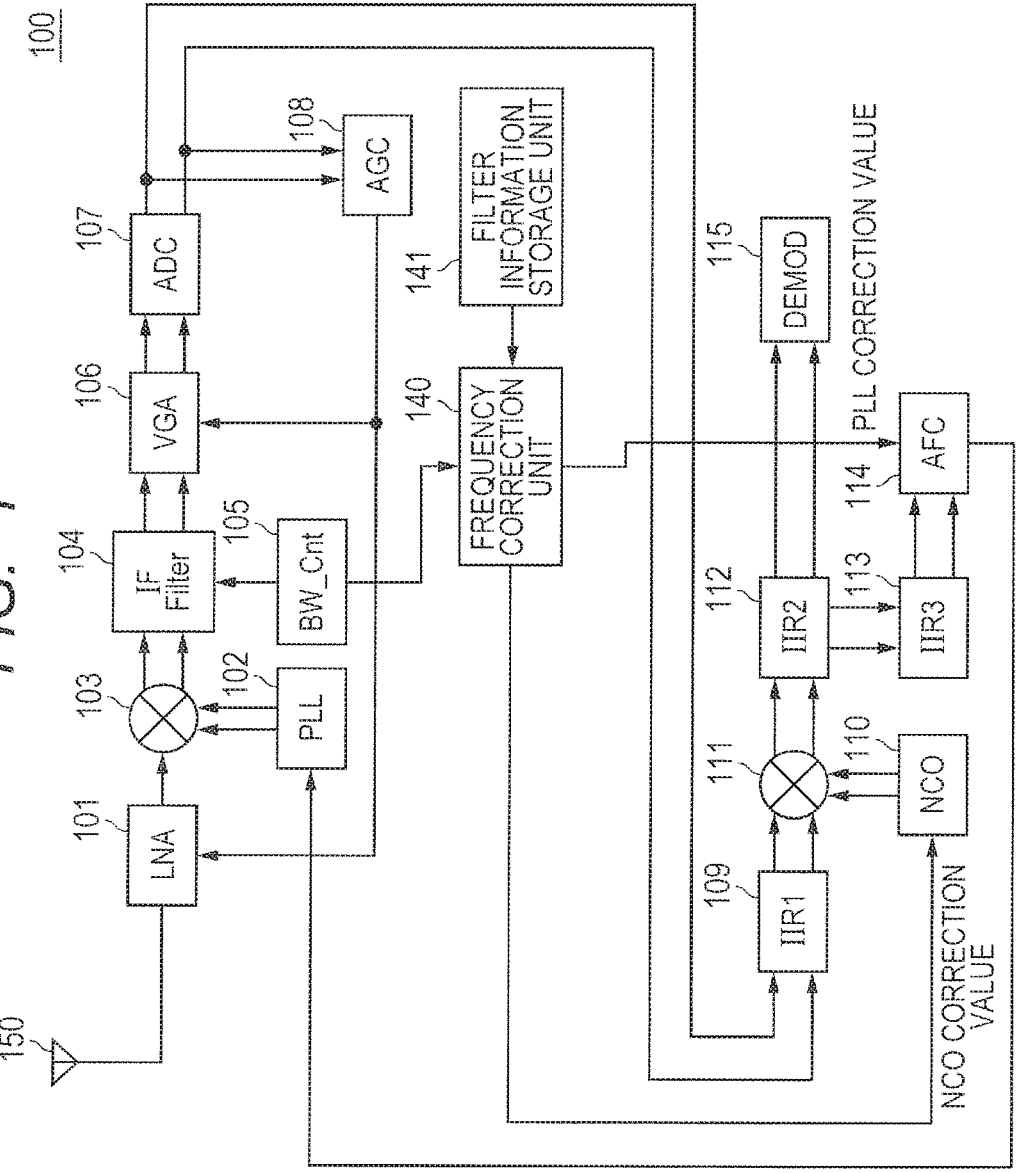
FIG. 1 is a block diagram illustrating a radio receiver according to a first embodiment.

FIG. 1 illustrates a radio receiver according to a first embodiment. A radio receiver 100 includes an LNA 101, a PLL 102, a mixer 103, an IF filter 104, a band control unit 105, a VGA 106, an AD converter 107, an AGC unit 108, an IIR filter 109, an NCO 110, a mixer 111, an IIR filter 112, an IIR filter 113, an AFC unit 114, a demodulator 115, a frequency correction unit 140, and a filter information storage unit 141. In the configuration of the radio receiver 100 according to this embodiment, the frequency correction unit 140 and the filter information storage unit 141 are added to the respective components of the radio receiver 500 used for study illustrated in FIG. 8.

An antenna 150 receives, for example, a radio frequency signal (RF signal) in a SubGHz band. The LNA 101 amplifies the RF signal. The PLL 102 configures a local oscillator whose oscillation frequency is variable. The PLL 102 outputs a local oscillation signal to the mixer 103. The mixer 103 configures a quadrature demodulator. The mixer 103 multiplies the RF signal inputted through the LNA 101 and the local oscillation signal outputted from the PLL 102, and generates an intermediate frequency signal (IF signal). The mixer 103 that has multiplied the RF signal and the local oscillation signal down-converts the RF signal in the SubGHz band to a low intermediate frequency signal (Low-IF signal) of, for example, 500 kHz.

The IF filter 104 is a band pass filter band-limiting the IF signal. The IF filter 104 band-limits the IF signal by the passing characteristic selected from a plurality of passing characteristics. As the IF filter 104, for example, an analog RC filter including a resistor and a capacitor and whose passband is variable is used. The IF filter 104 changes at least one of the resistance value of the resistor and the capacitance value of the capacitor, for example, the capacitance value of the capacitor, to change the passband. At least one of the resistance value of the resistor and the capacitance value of the capacitor is calibrated so that for example, the passband width of each of the passing characteristics of the IF filter 104 is a predetermined band width. The IF filter 104 band-limits the IF signal to attenuate the interference wave included in the IF signal.

The VGA 106 amplifies the band-limited IF signal. The AD converter 107 converts the amplified IF signal to a digital signal. The AGC unit 108 adjusts the gains of the LNA 101 and the VGA 106 based on the IF signal converted to the digital signal, and controls the electric power of the IF signal inputted to the AD converter 107 to an appropriate electric power value.

The IF signal converted to the digital signal by the AD converter 107 is inputted through the IIR filter 109 to the mixer 111. The NCO 110 is an oscillator whose oscillation frequency is variable according to a numerical value inputted. The NCO 110 outputs an oscillation signal of, for example, 500 kHz, to the mixer 111. The mixer 111 complex-multiplies the oscillation signal outputted from the NCO 111 and the IF signal inputted through the IIR filter 109, and down-converts the IF signal to a base band (BB) signal. The NCO 110 and the mixer 111 configure a base band conversion unit converting the IF signal to the BB signal.

The BB signal outputted from the mixer 111 is inputted through the filter IIR 112 to the demodulator 115, and the demodulator 115 then performs demodulation processing and the like with respect to the inputted BB signal. In addition, the BB signal outputted from the mixer 111 is inputted through the IIR filter 112 and the IIR filter 113 to the AFC unit 114. The AFC unit (frequency control unit) 114 performs an AFC operation to correct the frequency deviation. More specifically, the AFC unit 114 controls the frequency of the local oscillation signal outputted from the PLL 102 based on the BB signal outputted from the IIR filter 113 so that the frequency of the IF signal is a predetermined frequency, and corrects the frequency deviation.

The band control unit (filter control unit) 105 controls the passing characteristic of the IF filter 104. When the AFC unit 114 performs the AFC operation, the band control unit 105 controls the passing characteristic of the IF filter 104 to the passing characteristic of a wide band. In a state where the band control unit 105 controls the passing characteristic of the IF filter 104 to the passing characteristic of the wide band, the AFC unit 114 controls the oscillation frequency of the PLL 102 so that the frequency of the IF signal is the predetermined frequency. After the oscillation frequency is controlled so that the frequency of the IF signal is the predetermined frequency, the band control unit 105 changes the passing characteristic of the IF filter 104 from the passing characteristic of the wide band to the passing characteristic of a narrow band. For example, the band control unit 105 controls the passband width of the IF filter 104 to 700 kHz during the AFC operation, and controls the passband width of the IF filter 104 to 450 kHz after the AFC operation.

The filter information storage unit 141 stores passing characteristic information including information representing the center frequency of the passband of each of the passing characteristics, which can be selected by the IF filter 104. The frequency correction unit 140 refers to the passing characteristic information, and corrects the oscillation frequency of the PLL 102 through the AFC unit 114. In addition, the frequency correction unit 140 refers to the passing characteristic information, and corrects the oscillation frequency of the NCO 110. When the band control unit 105 changes the passing characteristic of the IF filter 104, the frequency correction unit 140 corrects the oscillation frequency of the PLL 102 by the amount according to the difference between the center frequency of the passband of the passing characteristic before the change and the center frequency of the passband of the passing characteristic after the change, and corrects the oscillation frequency of the NCO 110 by the amount according to the difference between the center frequency of the passband of the passing characteristic before the change and the center frequency of the passband of the passing characteristic after the change.

Specifically, when the AFC is completed to change the passing characteristic of the IF filter 104 from the passing characteristic of the wide band to the passing characteristic of the narrow band, the frequency correction unit 140 outputs, to the AFC unit 114, a PLL correction value according to the difference between the center frequency of the passband of the passing characteristic of the wide band and the center frequency of the passband of the passing characteristic of the narrow band. The AFC unit 114 corrects the oscillation frequency of the PLL 102 by the correction amount according to the inputted PLL correction value. In addition, the frequency correction unit 140 outputs an NCO correction value according to the difference between the center frequency of the passband of the passing characteristic of the wide band and the center frequency of the passband of the passing characteristic of the narrow band, and corrects the oscillation frequency of the NCO 110.

The Passing Characteristic Information

Figures 2, 3:
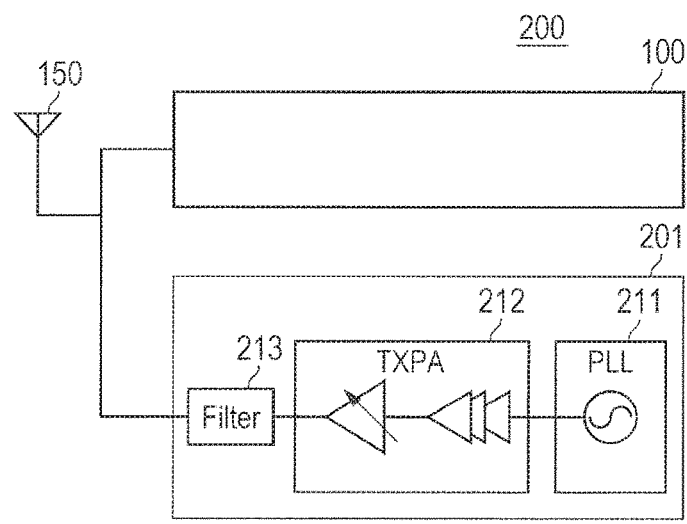
FIG. 2 is a table illustrating an example of passing characteristic information.
FIG. 3 is a block diagram illustrating the configuration example of a radio transmitter and receiver.

The passing characteristic information will be described. FIG. 2 illustrates an example of the passing characteristic information stored in the filter information storage unit 141. The passing characteristic information includes, for example, the cut-off frequency on the low frequency side, the cut-off frequency on the high frequency side, the band width, and the center frequency of the band width (BW). For example, the passing characteristic information is stored to be associated with the capacitance parameter adjustment code that can be changed by the IF filter. In FIG. 2, the targeted center frequency may be represented by the difference between the targeted center frequency and a reference frequency, for example, the center frequency of the capacitance parameter adjustment code "0".

During the AFC operation, for example, the band control unit 105 controls the capacitance value of the capacitor of the IF filter 104 to the capacitance value represented as the capacitance parameter adjustment code "0". In this case, the IF filter 104 band-limits the IF signal by the passing characteristic in which the passband is from 250 kHz to 750 kHz. At this time, the passband width is 500 kHz, and the center frequency of the passband is 500 kHz.

After the AFC operation, for example, the band control unit 105 changes the capacitance value of the capacitor of the IF filter 104 to the capacitance value represented as the capacitance parameter adjustment code "7". In this case, the IF filter 104 band-limits the IF signal by the passing characteristic in which the passband is from 180 kHz to 560 kHz. At this time, the passband width is 380 kHz, and the center frequency of the passband is 370 kHz.

When the capacitance parameter adjustment code is changed from "0" to "7" by the IF filter 104, the frequency correction unit 140 refers to the passing characteristic information, and obtains the center frequency of 500 kHz of the capacitance parameter adjustment code "0" and the center frequency of 370 kHz of the capacitance parameter adjustment code "7". The frequency correction unit 140 generates the PLL correction value and the NCO correction value according to the center frequency difference of 130 kHz, outputs the PLL correction value to the AFC unit 114, and outputs the NCO correction value to the NCO 110.

The AFC unit 114 to which the PLL correction value is inputted shifts the frequency of the local oscillation signal outputted from the PLL 102, from the oscillation frequency adjusted during the AFC to the low frequency side by 130 kHz. In addition, the NCO 110 shifts the frequency of the oscillation signal outputted, to the low frequency side by 130 kHz. In such a manner, the frequency of the IF signal outputted from the mixer 103 can be made to coincide with the center frequency of the passband of the passing characteristic of the IF filter 104 after the change. In addition, the mixer 111 can convert the IF signal whose frequency is corrected, to the BB signal.

Radio Transmitter and Receiver

FIG. 3 illustrates the configuration example of a radio transmitter and receiver. A radio transmitter and receiver 200 has the radio receiver (radio reception unit) 100, and a radio transmitter (radio transmission unit) 201. The configuration of the radio receiver 100 is the same as the configuration illustrated in FIG. 1. The radio transmitter 201 has an oscillator 211, a transmission power amplifier 212, and a filter 213. The radio transmitter 201 is configured as, for example, a direct modulation system, and the PLL 211 outputs a local oscillation signal to the transmission power amplifier 212. The transmission power amplifier 212 modulates the local oscillation signal according to transmission data. The signal modulated by the transmission power amplifier 212 is outputted through the filter 213 for impedance matching to the antenna 150, and is radio-transmitted from the antenna 150.

The antenna 150 receives the RF signal transmitted from the transmitter included in another radio transmitter and receiver. The received RF signal is inputted to the radio receiver 100, and is processed. It should be noted that FIG. 3 illustrates the example in which the radio receiver 100 and the radio transmitter 201 are included in one apparatus, but the present invention is not limited to this. The radio receiver 100 and the radio transmitter 201 may be configured as different apparatuses, and the radio receiver 100 may receive the RF signal transmitted from the opposing radio transmitter 201.

Operation Procedure

Figure 4:
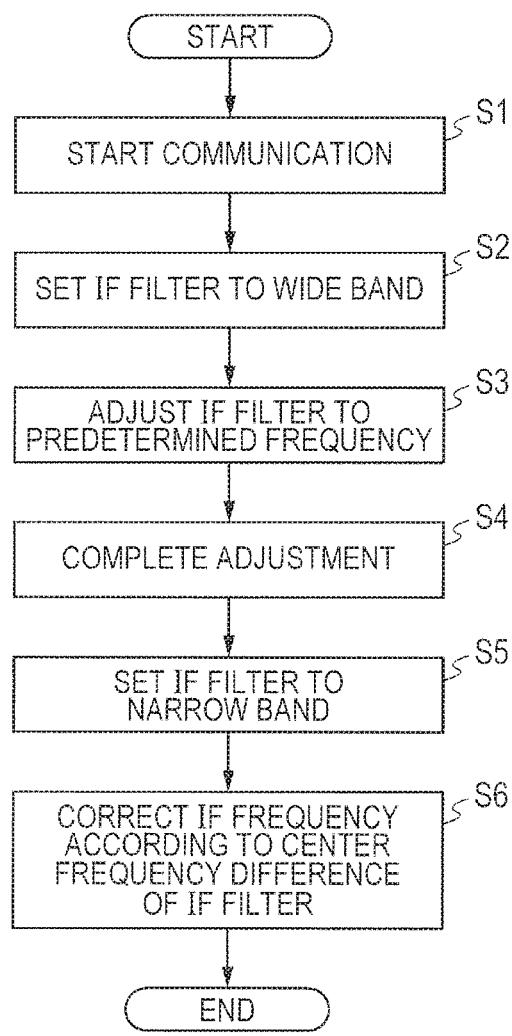
FIG. 4 is a flowchart illustrating the operation procedure of the radio receiver.

Successively, an operation procedure will be described. FIG. 4 illustrates the operation procedure of the radio receiver 100. The radio receiver 100 starts communication with the opposing radio transmitter 201 (see FIG. 3) (step S1). For example, the frequency (channel) of the RF signal received by the radio receiver 100 is determined according to the radio transmitter 201 that is a communication party, and the radio receiver 100 selects the channel according to the radio transmitter 201 that is the communication party, and starts the communication. When the communication is started, the band control unit 105 sets the passing characteristic of the IF filter 104 to the passing characteristic of the wide band (step S2).

In a state where the passing characteristic of the IF filter 104 is controlled to the passing characteristic of the wide band, the AFC unit 114 adjusts the oscillation frequency of the PLL 102 so that the frequency of the IF signal is the predetermined frequency (step S3). In step S2, the AFC unit 114 adjusts the oscillation frequency of the PLL 102 based on the BB signal generated based on the IF signal band-limited by the passing characteristic of the wide band. The AFC unit 114 may perform the AFC operation at switching the channel of the RF signal, in place of performing the AFC operation at the start of the communication or in addition to this.

When the frequency of the IF signal becomes the predetermined frequency, the AFC unit 114 completes the adjustment of the oscillation frequency of the PLL 102 (step S4). When the adjustment of the oscillation frequency is completed, the band control unit 105 switches the passing characteristic of the IF filter 104 from the passing characteristic of the wide band to the passing characteristic of the narrow band (step S5).

When the passing characteristic of the IF filter 104 is switched, the frequency correction unit 140 corrects the frequency of the IF signal according to the difference between the center frequency of the passband of the passing characteristic before the switching and the center frequency of the passband of the passing characteristic after the switching (step S6). In step S6, the frequency correction unit 140 refers to the filter information storage unit 141, and obtains the difference between the center frequency of the passband of the passing characteristic before the switching and the center frequency of the passband of the passing characteristic after the switching. The frequency correction unit 140 generates the PLL correction value and the NCO correction value corresponding to the obtained center frequency difference. The frequency correction unit 140 outputs the PLL correction value to the AFC unit 114, and outputs the NCO correction value to the NCO 110. The AFC unit 114 corrects the oscillation frequency of the PLL 102 adjusted in step S3 by the amount according to the PLL correction value. In addition, the NCO 110 changes the oscillation frequency by the amount according to the NCO correction value. In such a manner, the frequency of the IF signal can be made to follow the center frequency of the passband of the passing characteristic of the IF filter 104.

Operation Examples

Figure 5A:
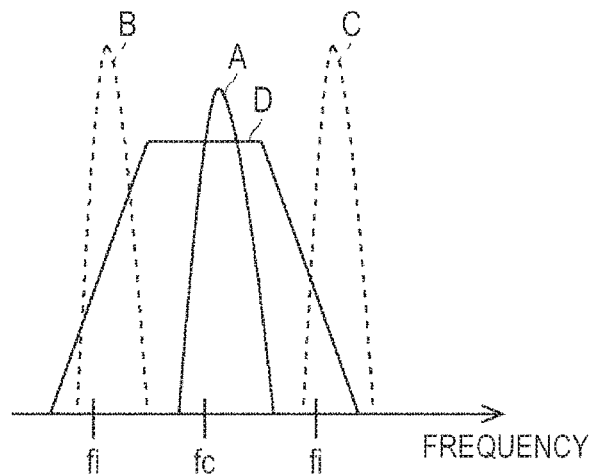
FIGS. 5A to 5C are schematic graphs illustrating the band of an IF signal and the passing characteristics of an IF filter before and after AFC.
Figure 5B:
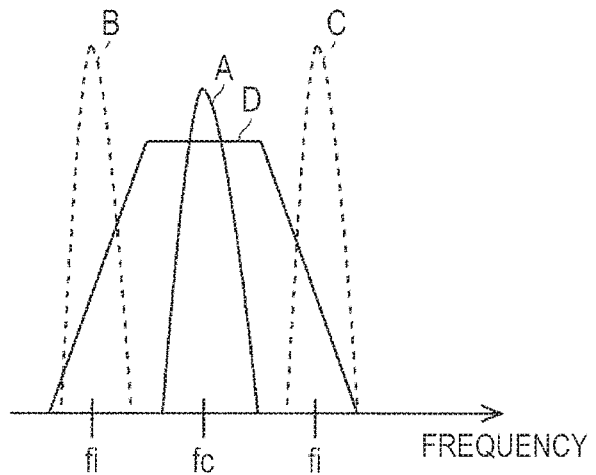
Figure 5C:
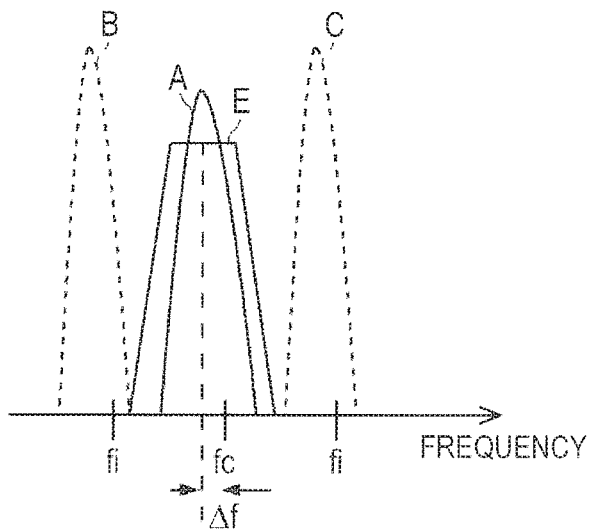

Successively, operation examples in the case where there is a deviation in the local oscillation signal on the reception side and in the case where there is a deviation in the local oscillation signal on the transmission side will be described. First, the case where there is a deviation in the oscillation signal of the PLL 102 on the reception side will be described. FIGS. 5A to 5C illustrate the band of the IF signal and the passing characteristics of the IF filter 104 before and after the AFC. FIG. 5A illustrates the band of the IF signal and the passing characteristic of the IF filter 104 before the AFC operation. In the stage before the AFC operation is performed, due to the presence of a deviation in the oscillation frequency of the PLL 102, the frequency of a desired wave A included in the IF signal (the center frequency) does not coincide with a predetermined frequency fc of, for example, 500 kHz and the like. In the example of FIG. 5A, the frequency of the desired wave A is shifted from the predetermined frequency fc to the high frequency side by the deviation of the oscillation frequency of the PLL 102.

When the AFC operation is performed, to include the signal band of the desired wave A in the passband of the IF filter 104 even when there is the deviation in the oscillation frequency, the passband of the IF filter 104 is required to be set widely with respect to the signal band (modulation width) of the desired wave A by the deviation assumed. During the AFC operation, the passing characteristic of the IF filter 104 is set to a passing characteristic D of the wide band, and the signal band of the desired wave A is included in the the passband of the passing characteristic D of the wide band. When the passing characteristic of the IF filter 104 is set to the passing characteristic D of the wide band, the passband of the IF filter 104 also includes the signal bands of interference waves B and C adjacent to the desired wave A. Like the frequency of the desired wave A, the frequencies of the interference waves B and C in the IF signal are also shifted to the high frequency side with respect to frequencies fi shifted from the predetermined frequency fc by the frequency corresponding to the channel interval.

FIG. 5B illustrates the band of the IF signal and the passing characteristic of the IF filter 104 at the completion of the AFC operation. The AFC unit 114 performs the AFC operation, and thus, the oscillation frequency of the PLL 102 is controlled so that the frequency of the IF signal (the desired wave A) coincides with the predetermined frequency fc. As illustrated in FIG. 5B, the center frequency of the passband of the passing characteristic D coincides with the predetermined frequency fc, and the frequency of the desired wave A also coincides with the center frequency of the passband of the IF filter 104. However, the passband of the IF filter 104 is set widely with respect to the signal band of the desired wave A, and when the reception of the signal (data demodulation) is started while the passing characteristic of the IF filter 104 is controlled to the passing characteristic D of the wide band, the reception performance is deteriorated.

FIG. 5C illustrates the band of the IF signal and the passing characteristic of the IF filter 104 after the AFC operation. After the AFC operation, the band control unit 105 controls the passing characteristic of the IF filter 104 to a passing characteristic E of the narrow band. The passband width of the passing characteristic E is almost equal to the width of the signal band of the desired wave A, and the passband of the passing characteristic E does not include the signal bands of the interference waves B and C. After the AFC operation, the passing characteristic of the IF filter 104 is changed to the passing characteristic E of the narrow band, so that the reception performance can be avoided from being deteriorated. However, the center frequency of the passband of the passing characteristic E is shifted from the predetermined frequency fc by $-\Delta f$. If the oscillation frequency of the PLL 102 remains the oscillation frequency at the completion of the AFC operation, the frequency of the desired wave A does not coincide with the center frequency of the passband of the passing characteristic E, and the signal band of the desired wave A is outside the passband of the IF filter 104.

In this embodiment, the frequency correction unit 140 refers to the filter information storage unit 141, and obtains the difference $-\Delta f$ between the center frequency of the passband of the passing characteristic D and the center frequency (fc) of the passband of the passing characteristic E. The frequency correction unit 140 generates the PLL correction value and the NCO correction value corresponding to the obtained center frequency difference $-\Delta f$. When the oscillation frequency of the PLL 102 is changed by the amount according to the PLL correction value and the oscillation frequency of the NCO 110 is changed by the amount according to the NCO correction value, the frequency of the desired wave A (the frequency of the IF signal) is changed from the predetermined frequency fc to fc$-\Delta f$, as illustrated in FIG. 5C. In such a manner, the frequency of the IF signal is made to follow the center frequency of the passband of the IF filter 104, so that it is possible to avoid the deterioration of the reception performance due to the change in the center frequency of the passband before the switching of the passing characteristic and the center frequency of the passband after the switching of the passing characteristic.

Figure 6A:
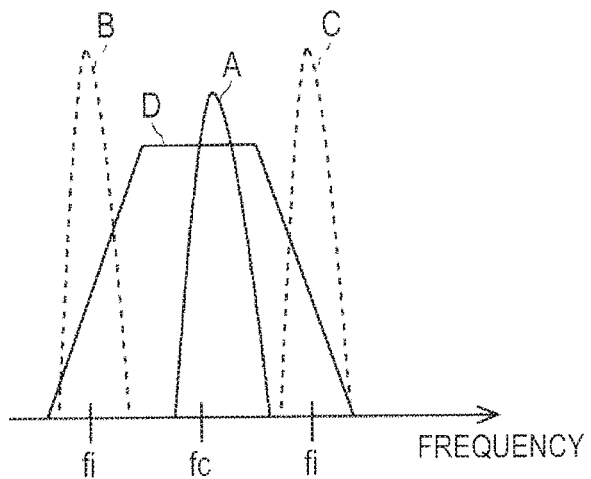
FIGS. 6A to 6C are schematic graphs illustrating the band of the IF signal and the passing characteristics of the IF filter before and after the AFC.
Figure 6B:
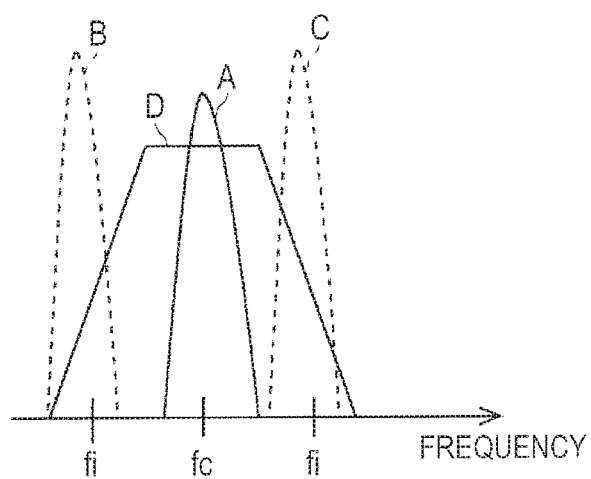
Figure 6C:
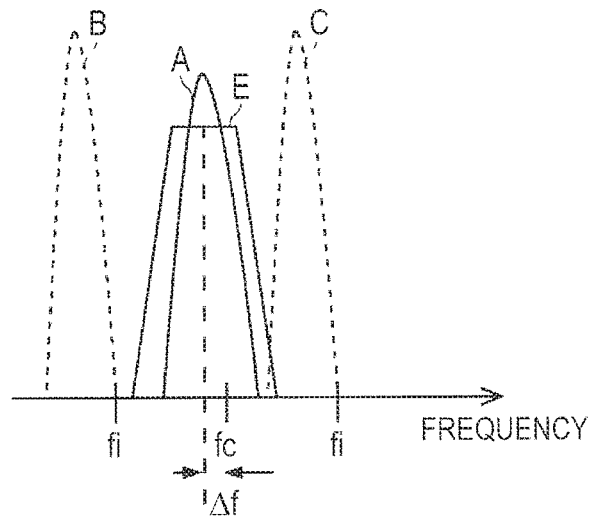

Successively, the case where there is a deviation in the oscillation frequency of the oscillator 211 (see FIG. 3) on the transmission side will be described. FIGS. 6A to 6C illustrate the band of the IF signal and the passing characteristics of the IF filter 104 before and after the AFC. FIG. 6A illustrates the band of the IF signal and the passing characteristic of the IF filter 104 before the AFC operation. When there is a deviation in the oscillation frequency of the oscillator 211 on the transmission side, only the frequency of the desired wave A (center frequency) is shifted from the predetermined frequency fc of, for example, 500 kHz and the like, by the deviation of the oscillation frequency of the oscillator 211. In the example of FIG. 6A, the frequency of the desired wave A is shifted from the predetermined frequency fc to the high frequency side by the deviation of the oscillation frequency of the oscillator 211. At this time, when there is not the deviation in the oscillation frequency of the PLL 102 on the reception side, the frequencies of the interference waves B and C adjacent to the desired wave A coincide with the frequencies fi shifted from the predetermined frequency fc by the frequency corresponding to the channel interval.

Like FIG. 5A, the passing characteristic of the IF filter 104 is set to the passing characteristic D during the AFC operation. The center frequency of the passband of the passing characteristic D is equal to the predetermined frequency fc. When the passing characteristic of the IF filter 104 is set to the passing characteristic D of the wide band, the passband of the IF filter 104 also includes the signal bands of the interference waves B and C.

FIG. 6B illustrates the band of the IF signal and the passing characteristic of the IF filter 104 at the completion of the AFC operation. The AFC unit 114 performs the AFC operation, and thus, as illustrated in FIG. 6B, the frequency of the IF signal (the desired wave A) moves to the predetermined frequency fc. At this time, the interference waves B and C also move by the same amount as the desired wave A. When FIGS. 6B and 5B are compared, the signal band of the interference wave C is close to the signal band of the desired wave A in FIG. 6B, as compared with FIG. 5B.

FIG. 6C illustrates the band of the IF signal and the passing characteristic of the IF filter 104 after the AFC operation. After the AFC operation, the band control unit 105 controls the passing characteristic of the IF filter 104 to the passing characteristic E of the narrow band. The passband width of the passing characteristic E is almost equal to the width of the signal band of the desired wave A. The frequency correction unit 140 refers to the filter information storage unit 141, obtains the difference $-\Delta f$ between the center frequency of the passband of the passing characteristic D and the center frequency of the passband of the passing characteristic E, and generates the PLL correction value and the NCO correction value corresponding to the obtained difference $-\Delta f$. When the oscillation frequency of the PLL 102 is changed by the amount according to the PLL correction value and the oscillation frequency of the NCO 110 is changed by the amount according to the NCO correction value, the frequency of the desired wave A (the frequency of the IF signal) is changed from the predetermined frequency fc to fc$-\Delta f$, as illustrated in FIG. 6C.

When there is the deviation in the oscillator 211 on the transmission side, as described above, the signal band of one of the adjacent interference waves or the signal band of the interference wave C in the case of FIG. 6B is close to the signal band of the desired wave A. In that case and when the frequency of the desired wave A and the center frequency of the passband of the IF filter 104 do not coincide with each other, the component of the interference wave C intrudes into the IF signal that has passed through the IF filter 104, so that the reception performance is sometimes deteriorated. In this embodiment, the frequency correction unit 140 is used to make the frequency of the IF signal follow the center frequency of the passband of the IF filter 104. In such a manner, even when there is the deviation in the oscillation frequency on the transmission side, it is possible to avoid the deterioration of the reception performance due to the change in the center frequency before and after the switching of the passband.

Summary

In this embodiment, the band control unit 105 controls the passing characteristic of the IF filter 104 to the passing characteristic of the wide band when the AFC unit 114 performs the AFC operation, and controls the passing characteristic of the IF filter 104 to the passing characteristic of the narrow band after the AFC operation. When the passing characteristic of the IF filter 104 is changed, the frequency correction unit 140 refers to the filter information storage unit 141, and obtains the difference between the center frequency of the passband before the change and the center frequency of the passband after the change. The frequency correction unit 140 corrects the oscillation frequency of the PLL 102 through the AFC unit 114 by the amount according to the obtained center frequency difference. In addition, the frequency correction unit 140 corrects the oscillation frequency of the NCO 110 by the amount according to the obtained center frequency difference. In such a manner, the frequency of the IF signal can be changed according to the change in the center frequency of the passband of the IF filter 104.

For example, when the IF filter 104 is the analog RC filter and changes the resistance value or the capacitance value to change the cut-off frequency and the band width, the configuration can be simplified, but it is difficult to change the cut-off frequency and the band width while the center frequency of the passband is held constant. In this embodiment, when the frequency correction unit 140 is used to change the passing characteristic of the IF filter 104, the frequency of the IF signal is corrected according to the difference between the center frequency of the passband before the change and the center frequency of the passband after the change. In such a manner, the frequency of the IF signal can be made to follow the center frequency of the passband changed with the change of the passing characteristic of the IF filter 104.

In this embodiment, the AFC operation is performed in a state where the passband width of the IF filter 104 is wide, and the down-converted signal (IF signal) of the desired channel is made to coincide with the center frequency of the passband of the IF filter 104. Thereafter, while the frequency of the IF signal is made to follow the center frequency of the passband of the IF filter 104, the passband width of the IF filter 104 is narrowed to the desired band width. In such a manner, even when the center frequency of the passband of the IF filter 104 is changed with the change of the passing characteristic, the interference waves can be prevented, so that the deterioration of the reception performance can be minimum. In addition, in particular, it is possible to prevent the deterioration of the interference characteristic after the AFC is performed, which becomes a problem when there is the deviation in the oscillation frequency on the transmission side. Further, in this embodiment, the analog RC filter having a simple configuration can be used as the IF filter 104, so that there is the advantage that the circuit structure is not complicated.

Second Embodiment

Successively, a second embodiment will be described. The configuration of a radio receiver according to this embodiment is the same as the configuration of the radio receiver 100 according to the first embodiment illustrated in FIG. 1. In the first embodiment, when the passing characteristic of the IF filter 104 is changed from the passing characteristic of the wide band to the passing characteristic of the narrow band, the frequency correction unit 140 corrects the oscillation frequency of the PLL 102 and the oscillation frequency of the NCO 110 according to the difference between the center frequency of the passband before the change and the center frequency of the passband after the change. In this embodiment, further, the frequency correction unit 140 refers to the filter information storage unit 141, obtains the center frequency of the passband of the passing characteristic of the wide band, and corrects the oscillation frequency of the PLL 102 and the oscillation frequency of the NCO 110 so that the frequency of the IF signal is equal to the center frequency of the passband of the passing characteristic of the wide band. Other points are the same as the first embodiment.

Here, the resistance value of the resistor and the capacitance value of the capacitor, the resistor and the capacitor configuring the analog RC filter used as the IF filter 104, are adjusted so that for example, the passing characteristic of the IF filter 104 is suitable for the design target during product shipping. However, when the calibration is performed so that the passband width is suitable for the desired design target, the center frequency of the passband is changed before and after the calibration, and is sometimes shifted from the design target. In this embodiment, the adjustment to make the frequency of the IF signal coincide with the center frequency of the passband of the IF filter 104 is performed with respect to the shift of the center frequency, so that the reception performance is improved and the variation in the reception performance due to the manufacturing variation is prevented.

Design Example

Figure 7A:
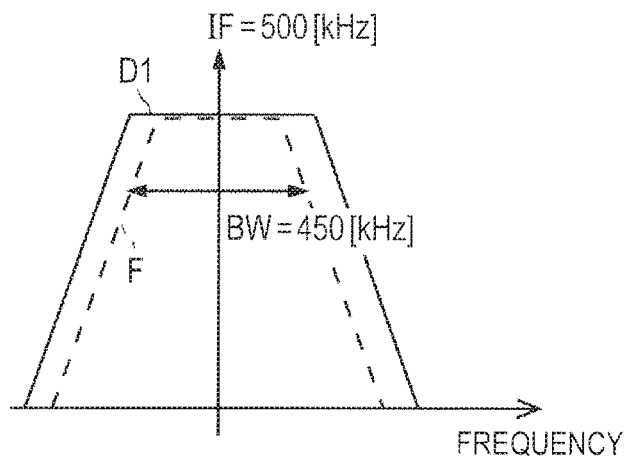
FIGS. 7A to 7C are schematic graphs illustrating the passing characteristics of the IF filter.
Figure 7B:
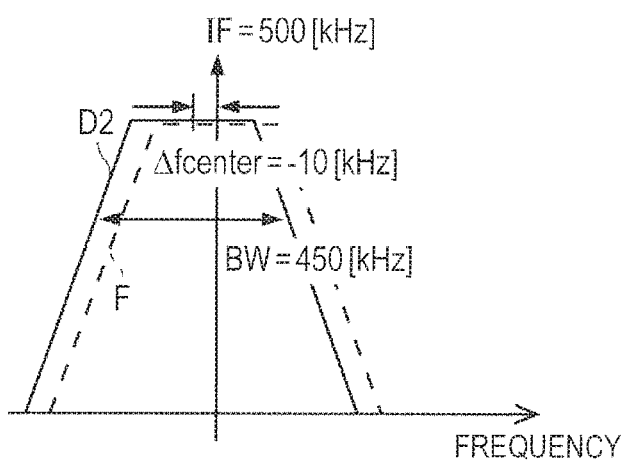
Figure 7C:
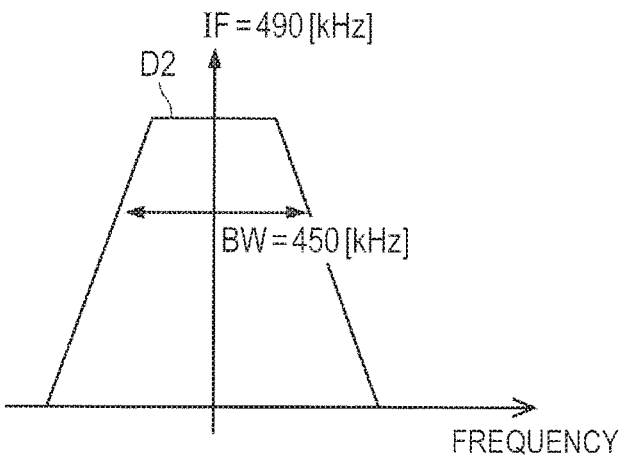

FIGS. 7A to 7C illustrate the passing characteristics of the IF filter 104. In FIGS. 7A to 7C, the ordinate axis represents the gain, and the abscissa axis represents the frequency. Referring to FIGS. 7A to 7C, the procedure of the calibration when the design target of the analog RC filter used as the IF filter 104 includes the frequency of the IF signal of 500 kHz and the passband width of 450 kHz will be described. FIG. 7A illustrates the passing characteristic of the IF filter 104. In FIG. 7A, a passing characteristic F represents the passing characteristic in which the center frequency of the passband that is the design target is 500 kHz and the passband width that is the design target is 450 kHz. The center frequency and the passband width of the passband of a passing characteristic D1 of the IF filter 104 actually manufactured are shifted from the design target, so that the calibration is required.

FIG. 7B illustrates the passing characteristic of the IF filter 104 after the calibration. The calibration is performed by adjusting the resistance value of the resistor and the capacitance value of the capacitor, the resistor and the capacitor configuring the IF filter 104. By performing the calibration, the passband width of a passing characteristic D2 of the IF filter 104 after the calibration can be made to coincide with 450 kHz that is the design target. However, since the adjustment of the passing characteristic is the adjustment using the resistance value and the capacitance value, as illustrated in FIG. 7B, the center frequency of the passband of the passing characteristic D2 is shifted from the frequency of the IF signal of 500 kHz that is the design target by $\Delta f$ center=−10 kHz. The shift of the center frequency represents the remaining error of the calibration.

FIG. 7C illustrates the passing characteristic of the IF filter 104 when the radio receiver 100 is used. When the radio receiver 100 is used, the calibrated passing characteristic D2 of the IF filter 104 is used as, for example, the passing characteristic D of the wide band in FIG. 5A. In this embodiment, the passing characteristic information including the information about the center frequency of the passing characteristic D2 is stored in the filter information storage unit 141. When the band control unit 105 controls the passing characteristic of the IF filter 104 to the passing characteristic D2, the frequency correction unit 140 obtains the center frequency of the passband of the passing characteristic D2 from the filter information storage unit 141. For example, the frequency correction unit 140 generates the PLL correction value and the NCO correction value according to the difference between the nominal frequency of the IF signal that is the design target and the center frequency of the passband of the passing characteristic D2. The frequency correction unit 140 generates the PLL correction value and the NCO correction value corresponding to the remaining error of −10 kHz of the calibration, outputs the PLL correction value to the AFC unit 114, and outputs the NCO correction value to the NCO 110.

In the case of the above, the NCO 110 outputs the oscillation signal of 490 kHz to the mixer 111. In addition, the AFC unit 114 controls the oscillation frequency of the PLL 102 so that the frequency of the IF signal is 490 kHz. In such a manner, even when the center frequency of the passband of the IF filter 104 is shifted from the design target, the AFC operation can be performed in a state where the center frequency of the passband of the IF filter 104 and the frequency of the IF signal coincide with each other.

Summary

In this embodiment, the frequency correction unit 140 refers to the filter information storage unit 141, and obtains the center frequency of the passband of the IF filter 104. The frequency correction unit 140 controls the frequency of the local oscillation signal outputted from the PLL 102 through the AFC unit 114 so that the frequency of the IF signal coincides with the center frequency of the passband of the IF filter 104. In such a manner, it is possible to correct the shift of the cut-off frequency (the center frequency of the passband) due to the manufacturing variation in the resistance value or the capacitance value of the band variable analog RC filter used as the IF filter 104. The filter performance of the IF filter 104 correlates with the reception performance, and the variation in the filter performance is prevented, so that it is possible to prevent the deterioration of the reception performance due to the manufacturing variation in the passing characteristic of the IF filter 104.

Modifications

In the first embodiment, the example in which the band control unit 105 switches the passing characteristic of the IF filter 104 between two stages of the passing characteristic of the wide band and the passing characteristic of the narrow band has been described, but the present invention is not limited to this. While the AFC operation is performed, the band control unit 105 may gradually narrow the passband of the IF filter 104 in a plurality of stages. In that case, each time the passing characteristic of the IF filter 104 is changed, the frequency correction unit 140 may correct the frequency of the IF signal according to the difference between the center frequency of the passband before the change and the center frequency of the passband after the change.

In the second embodiment, the band control unit 105 does not necessarily change the passing characteristic of the IF filter 104 during the AFC operation and after the AFC operation. In the second embodiment, the passing characteristic of the IF filter 104 is not required to be changed after the AFC operation, and when the IF signal is passed by the certain passing characteristic of the IF filter 104, the second embodiment is applicable to the radio receiver that makes the frequency of the IF signal coincide with the center frequency of the passband of the IF filter 104.

The inventions made by the present inventors have been specifically described above based on the embodiments, but the present invention is not limited to the already described embodiments, and needless to say, various modifications can be made in the scope not departing from its purport.

For example, part or all of the embodiments can be described like the following additions, but the present invention is not limited to them.

Addition 1

A radio receiver includes a first oscillator whose oscillation frequency is variable, a quadrature demodulator including a frequency mixer mixing a radio frequency signal and an oscillation signal outputted from the first oscillator and generating an intermediate frequency signal having an intermediate frequency lower than the frequency of the radio frequency signal, a band pass filter band-limiting the intermediate frequency signal by the passing characteristic selected from a plurality of passing characteristics, a filter control unit controlling the passing characteristic of the band pass filter, a filter information storage unit storing passing characteristic information including information representing the center frequency of the passband of each of the passing characteristics, a frequency control unit controlling the oscillation frequency so that the frequency of the intermediate frequency signal is a predetermined frequency, and a frequency correction unit referring to the passing characteristic information and correcting the oscillation frequency controlled by the frequency control unit. In a state where the filter control unit controls the passing characteristic of the band pass filter to a first passing characteristic, the frequency control unit controls the oscillation frequency so that the frequency of the intermediate frequency signal is the predetermined frequency. After the frequency control unit controls the oscillation frequency so that the frequency of the intermediate frequency signal is the predetermined frequency, the filter control unit controls the passing characteristic of the band pass filter from the first passing characteristic to a second passing characteristic having a passband width narrower than the passband width of the first passing characteristic. When the passing characteristic of the band pass filter is changed from the first passing characteristic to the second passing characteristic, the frequency correction unit refers to the filter information storage unit, and corrects the oscillation frequency controlled by the frequency control unit by the amount according to the difference between the center frequency of the first passing characteristic and the center frequency of the second passing characteristic.

Addition 2

The radio receiver according to addition 1 further has an analog-to-digital convertor converting the intermediate frequency signal to a digital signal, and a base band conversion unit converting the intermediate frequency signal converted to the digital signal to a base band signal.

Addition 3

In the radio receiver according to addition 2, the frequency control unit controls the oscillation frequency based on the base band signal so that the frequency of the intermediate frequency signal is the predetermined frequency.

Addition 4

In the radio receiver according to addition 2, the base band conversion unit includes a second oscillator whose oscillation frequency is variable, and a complex multiplier complex-multiplying the oscillation signal outputted from the second oscillator and the intermediate frequency signal converted to the digital signal and outputting the base band signal.

Addition 5

In the radio receiver according to addition 4, when the passing characteristic of the band pass filter is changed from the first passing characteristic to the second passing characteristic, the frequency correction unit further corrects the oscillation frequency of the second oscillator by the amount according to the difference between the center frequency of the first passing characteristic and the center frequency of the second passing characteristic.

Addition 6

In the radio receiver according to addition 1, the frequency control unit controls the oscillation frequency at the start of communication.

Addition 7

In the radio receiver according to addition 1, the frequency control unit controls the oscillation frequency at the switching of the channel of the radio frequency signal.

Addition 8

In the radio receiver according to addition 1, the predetermined frequency is the same frequency as the center frequency of the passband of the first passing characteristic of the band pass filter.

Addition 9

In the radio receiver according to addition 1, further, the frequency correction unit refers to the filter information storage unit, obtains the center frequency of the passband of the first passing characteristic, and corrects the oscillation frequency so that the intermediate frequency signal is equal to the center frequency of the passband of the first passing characteristic.

Addition 10

In the radio receiver according to addition 1, the band pass filter is an analog filter including a resistor and a capacitor.

Addition 11

In the radio receiver according to addition 10, at least one of the resistance value of the resistor and the capacitance of the capacitor is calibrated so that the passband width of each of the passing characteristics of the band pass filter is a predetermined band width.

Addition 12

A radio transmitter and receiver includes an antenna, a radio transmission unit transmitting a radio frequency signal through the antenna, and a radio reception unit receiving the radio frequency signal through the antenna. The radio reception unit has a first oscillator whose oscillation frequency is variable, a quadrature demodulator including a frequency mixer mixing the radio frequency signal received through the antenna and an oscillation signal outputted from the first oscillator and generating an intermediate frequency signal having an intermediate frequency lower than the frequency of the radio frequency signal, a band pass filter band-limiting the intermediate frequency signal by the passing characteristic selected from a plurality of passing characteristics, a filter control unit controlling the passing characteristic of the band pass filter, a filter information storage unit storing passing characteristic information including information representing the center frequency of the passband of each of the passing characteristics, a frequency control unit controlling the oscillation frequency so that the frequency of the intermediate frequency signal is a predetermined frequency, and a frequency correction unit referring to the passing characteristic information and correcting the oscillation frequency controlled by the frequency control unit. In a state where the filter control unit controls the passing characteristic of the band pass filter to a first passing characteristic, the frequency control unit controls the oscillation frequency so that the frequency of the intermediate frequency signal is the predetermined frequency. After the frequency control unit controls the oscillation frequency so that the frequency of the intermediate frequency signal is the predetermined frequency, the filter control unit controls the passing characteristic of the band pass filter from the first passing characteristic to a second passing characteristic having a passband width narrower than the passband width of the first passing characteristic. When the passing characteristic of the band pass filter is changed from the first passing characteristic to the second passing characteristic, the frequency correction unit refers to the filter information storage unit, and corrects the oscillation frequency controlled by the frequency control unit by the amount according to the difference between the center frequency of the first passing characteristic and the center frequency of the second passing characteristic.

Addition 13

An intermediate frequency signal generation method includes the steps of mixing a radio frequency signal and an oscillation signal outputted from an oscillator to generate an intermediate frequency signal having an intermediate frequency lower than the frequency of the radio frequency signal, using a band pass filter band-limiting the intermediate frequency signal by the passing characteristic selected from a plurality of passing characteristics to band-limit the intermediate frequency signal by a first passing characteristic, controlling the oscillation frequency of the oscillator so that the frequency of the intermediate frequency signal is a predetermined frequency, after the frequency of the intermediate frequency signal is controlled to be the predetermined frequency, using the band pass filter to band-limit the intermediate frequency signal by a second passing characteristic having a passband width narrower than the passband width of the first passing characteristic, and correcting the oscillation frequency by the amount according to the difference between the center frequency of the first passing characteristic and the center frequency of the second passing characteristic.

Addition 14

A radio receiver includes an oscillator whose oscillation frequency is variable, a quadrature demodulator including a frequency mixer mixing a radio frequency signal and an oscillation signal outputted from the oscillator and generating an intermediate frequency signal having an intermediate frequency lower than the frequency of the radio frequency signal, a band pass filter band-limiting the intermediate frequency signal, a filter information storage unit storing information representing the center frequency of the passband of the band pass filter, a frequency control unit controlling the oscillation frequency so that the frequency of the intermediate frequency signal is a predetermined frequency, and a frequency correction unit referring to the filter information storage unit and correcting the oscillation frequency so that the predetermined frequency is equal to the center frequency.

Addition 15

An intermediate frequency signal generation method includes the steps of mixing a radio frequency signal and an oscillation signal outputted from an oscillator to generate an intermediate frequency signal having an intermediate frequency lower than the frequency of the radio frequency signal, using a band pass filter to band-limit the intermediate frequency signal, and obtaining information representing the center frequency of the passing characteristic of the band pass filter to control the oscillation frequency of the oscillator so that the frequency of the intermediate frequency signal coincides with the center frequency.

What is claimed is:

1. A radio receiver comprising:
a first oscillator whose oscillation frequency is variable;
a quadrature demodulator including a frequency mixer mixing a radio frequency signal and an oscillation signal outputted from the first oscillator and generating an intermediate frequency signal having an intermediate frequency lower than the frequency of the radio frequency signal;
a band pass filter band-limiting the intermediate frequency signal by the passing characteristic selected from a plurality of passing characteristics;
a filter control unit controlling the passing characteristic of the band pass filter;
a filter information storage unit storing passing characteristic information including information representing the center frequency of the passband of each of the passing characteristics;
a frequency control unit controlling the oscillation frequency so that the frequency of the intermediate frequency signal is a predetermined frequency; and
a frequency correction unit referring to the passing characteristic information and correcting the oscillation frequency controlled by the frequency control unit,
wherein in a state where the filter control unit controls the passing characteristic of the band pass filter to a first passing characteristic, the frequency control unit controls the oscillation frequency so that the frequency of the intermediate frequency signal is the predetermined frequency,
wherein after the frequency control unit controls the oscillation frequency so that the frequency of the intermediate frequency signal is the predetermined frequency, the filter control unit controls the passing characteristic of the band pass filter from the first passing characteristic to a second passing characteristic having a passband width narrower than the passband width of the first passing characteristic, and
wherein when the passing characteristic of the band pass filter is changed from the first passing characteristic to the second passing characteristic, the frequency correction unit refers to the filter information storage unit, and corrects the oscillation frequency controlled by the frequency control unit by the amount according to the difference between the center frequency of the first passing characteristic and the center frequency of the second passing characteristic.

2. The radio receiver according to claim 1, further comprising:
an analog-to-digital convertor converting the intermediate frequency signal to a digital signal; and
a base band conversion unit converting the intermediate frequency signal converted to the digital signal to a base band signal.

3. The radio receiver according to claim 2,
wherein the frequency control unit controls the oscillation frequency based on the base band signal so that the frequency of the intermediate frequency signal is the predetermined frequency.

4. The radio receiver according to claim 2,
wherein the base band conversion unit includes:
a second oscillator whose oscillation frequency is variable; and
a complex multiplier complex-multiplying the oscillation signal outputted from the second oscillator and the intermediate frequency signal converted to the digital signal and outputting the base band signal.

5. The radio receiver according to claim 4,
wherein when the passing characteristic of the band pass filter is changed from the first passing characteristic to the second passing characteristic, the frequency correction unit further corrects the oscillation frequency of the second oscillator by the amount according to the difference between the center frequency of the first passing characteristic and the center frequency of the second passing characteristic.

6. The radio receiver according to claim 1,
wherein the frequency control unit controls the oscillation frequency at the start of communication.

7. The radio receiver according to claim 1,
wherein the frequency control unit controls the oscillation frequency at the switching of the channel of the radio frequency signal.

8. The radio receiver according to claim 1,
wherein the predetermined frequency is the same frequency as the center frequency of the passband of the first passing characteristic of the band pass filter.

9. The radio receiver according to claim 1,
wherein further, the frequency correction unit refers to the filter information storage unit, obtains the center frequency of the passband of the first passing characteristic, and corrects the oscillation frequency so that the intermediate frequency signal is equal to the center frequency of the passband of the first passing characteristic.

10. The radio receiver according to claim 1,
wherein the band pass filter is an analog filter including a resistor and a capacitor.

11. The radio receiver according to claim 10,
wherein at least one of the resistance value of the resistor and the capacitance of the capacitor is calibrated so that the passband width of each of the passing characteristics of the band pass filter is a predetermined band width.

* * * * *